United States Patent [19]

Arita et al.

[11] Patent Number: 5,252,854
[45] Date of Patent: Oct. 12, 1993

[54] SEMICONDUCTOR DEVICE HAVING STACKED LEAD STRUCTURE

[75] Inventors: Junichi Arita, Musashino; Akihiko Iwaya, Fuchuu; Tomoo Matsuzawa, Tokyo; Masahiro Ichitani, Kodaira, both of Japan

[73] Assignees: Hitachi, Ltd., Tokyo; Hitachi Microcomputer, Kodaira, both of Japan

[21] Appl. No.: 717,262

[22] Filed: Jun. 18, 1991

[30] Foreign Application Priority Data

Jun. 20, 1990 [JP] Japan ................... 2-163928
May 10, 1991 [JP] Japan ................... 3-105622

[51] Int. Cl.⁵ .......................... H01L 23/02
[52] U.S. Cl. ................... 257/676; 257/692; 257/691; 257/677
[58] Field of Search ............. 357/70, 72; 257/666, 257/676, 677, 691, 692

[56] References Cited

U.S. PATENT DOCUMENTS 4,862,254  8/1989  Pashby et al. ............... 357/72
4,965,654 10/1990  Karner et al. ............... 357/70
5,122,858  6/1992  Mahulikar et al. ........... 357/72

Primary Examiner—William Mintel
Assistant Examiner—Roy Potter
Attorney, Agent, or Firm—Antonelli, Terry, Stout & Kraus

[57] ABSTRACT

Disclosed is a resin-molded type semiconductor device having a thin package while avoiding short-circuit of wires with a common inner lead. In the construction thereof, a common inner lead constituted by a thin metal sheet is fixed onto a circuit-forming surface of a rectangular semiconductor chip substantially in parallel with longer sides of the chip and substantially in a central region of the chip, and a plurality of inner leads for signals, which are in the form of a frame, are stacked and fixed onto the common inner lead; then these components are molded with resin.

44 Claims, 7 Drawing Sheets

5,252,854

SEMICONDUCTOR DEVICE HAVING STACKED LEAD STRUCTURE

BACKGROUND OF THE INVENTION

The present invention relates to a semiconductor device and method of forming such device, and particularly to a technique which is effectively applicable to a thin package of a large scale integrated circuit having a high integration density.

With an increase in the integration density of semiconductor devices, semiconductor chip sizes now tend to become larger. In view of this point, there has been proposed such a lead-on-chip (LOC) type resin-molded package as disclosed in Japanese Patent Laid-Open No. 241959/86 (corresponding to U.S. Pat. No. 4,862,245). According to this proposal, the semiconductor device has a plurality of inner leads for signals bonded (using an adhesive) onto a circuit-forming surface of a semiconductor chip, through the semiconductor chip and an insulating film. The inner leads for signals, and bonding pads, disposed centrally on the semiconductor chip, are electrically connected with each other through bonding wires and sealed with a molding resin, and a common inner lead (a bus bar inner lead) is provided between the bonding pads and the inner leads for signals, in the vicinity of a longitudinal central line of the circuit-forming surface of the semiconductor chip.

SUMMARY OF THE INVENTION

However, as a result of studies concerning the proposal referred to above, the present inventors found out the following problems.

In electrically connecting the foregoing inner leads and bonding pads together using bonding wires, since the common inner lead is positioned between the external terminals (bonding pads) on the semiconductor chip and the inner leads for signals the bonding wires to be bonded to the inner leads for signals must jump over the common inner lead. Therefore, it is very likely that the common inner lead and the wires will come into contact with each other, causing a short-circuit. In order to prevent such short-circuit, it is necessary to make a wire loop shape of the bonding wires higher than that of ordinary wires. For this reason it is very difficult to apply a semiconductor device of LOC structure to, say, a thin package TSOP (thin small outline package) having a thickness of about 1 mm. More particularly, in such thin package it is required that the distance from a principal surface of a semiconductor chip up to a surface of an overlying sealing resin be 400 μm at most. Otherwise, it will be impossible to attain a package thickness of 1 mm or so. Therefore, in the case where bonding is made while jumping over the common inner lead, as shown in FIG. 7(A), it is impossible to obtain a thin package because the loop height is required to be about 600 μm.

It is an object of the present invention to provide a highly reliable, thin semiconductor device of LOC structure, and a process of forming such device.

It is a further object of the present invention to provide a relatively thin semiconductor device, particularly a relatively thin resin-molded semiconductor device, and a method of producing the same.

It is still a further object of the present invention to provide a relatively thin semiconductor device, using bonding wires to electrically connect bonding pads and inner leads for signals, wherein short-circuiting between the bonding wires and a common inner lead can be avoided.

The above and other objects as well as novel features of the present invention will become apparent from the following description and the accompanying drawings.

The following is a brief summary of representative aspects of the present invention out of those disclosed herein. The following representative aspects are illustrative, and are not limiting, of the present invention.

In one aspect of the present invention there is provided a semiconductor device wherein a common inner lead is provided (for example, is provided in the vicinity of a central line in X or Y direction of a circuit-forming surface of a semiconductor chip), and a plurality of inner leads for signals are provided, on the circuit-forming surface of the semiconductor chip. The inner leads for signals and the common inner lead are electrically connected with the semiconductor chip through bonding wires, and, e.g., sealed with a molding resin. The common inner lead is constructed by a thin metallic sheet, and the common inner lead and the plural inner leads for signals are stacked on the circuit-forming surface of the semiconductor chip, with an insulating adhesive and/or an insulating tape interposed between the common inner lead and plural inner leads.

In this construction, the bonding wires connect between the metallic sheet and the bonding pads in the portions serving as trenches each formed between adjacent inner leads.

Most desirably, in this construction an insulating tape is provided between the common inner lead and the inner lead for signals, in stacked form. The insulating tape has two functions, to provide adhesion and to provide insulation. An insulating tape is desirably provided between the common inner lead and plural inner leads for signals, with adhesive on both sides of the insulating tape. Adhesive is desirably provided between the common inner lead or plural inner leads (whichever is closest to the semiconductor chip) and the semiconductor chip.

In another aspect of the present invention there is provided a semiconductor device comprising a semiconductor chip having a principal surface on which are formed an integrated circuit and a plurality of external terminals; leads comprising a group of leads for providing signals and a group of leads for providing voltages, each lead comprising an inner portion and an outer portion, the outer portion projecting from a molding resin, the inner portion consisting of a first region to which wire is bonded and a second region connected to the first region; a metal layer interposed between the principal surface of the chip and the first regions of the inner portions (or provided on the first regions of the inner portions) and connected electrically to the voltage-providing leads; a first group of wires which connect the inner portions and various of the external terminals electrically with each other; a second group of wires which connect the metal layer and various ones of the external terminals electrically with each other; an adhesive for bonding between the semiconductor chip and the metal layer, and also between the metal layer and the first regions of the inner portions (or for bonding between the semiconductor chip and the first regions of the inner portions, and also between the first regions and metal layer); and a molding resin for sealing the semiconductor chip, inner portions, metal layer and the wires.

According to the above structure, since the common inner lead constituted by a tape-like metallic sheet extends across the semiconductor chip, it is possible to effect a multiple bonding. Besides, since this common inner lead is formed below or above the inner leads for signals in a stacked fashion, there are no longer bonding wires jumping over the common inner lead and hence it is possible to avoid the danger of short-circuit completely.

Moreover, the height from the chip surface up to the top of each bonding wire can be made low by using metal foil as the common inner lead, and hence it is possible to provide a semiconductor device of a thin package having LOC structure.

Further, in the wire bonding between the metal foil and the bonding pads, the wire loop height can be made lower by utilizing the trench portions between the inner leads for signals, and hence it is possible to attain a thin package.

DESCRIPTION OF PREFERRED EMBODIMENTS

Figure 1:
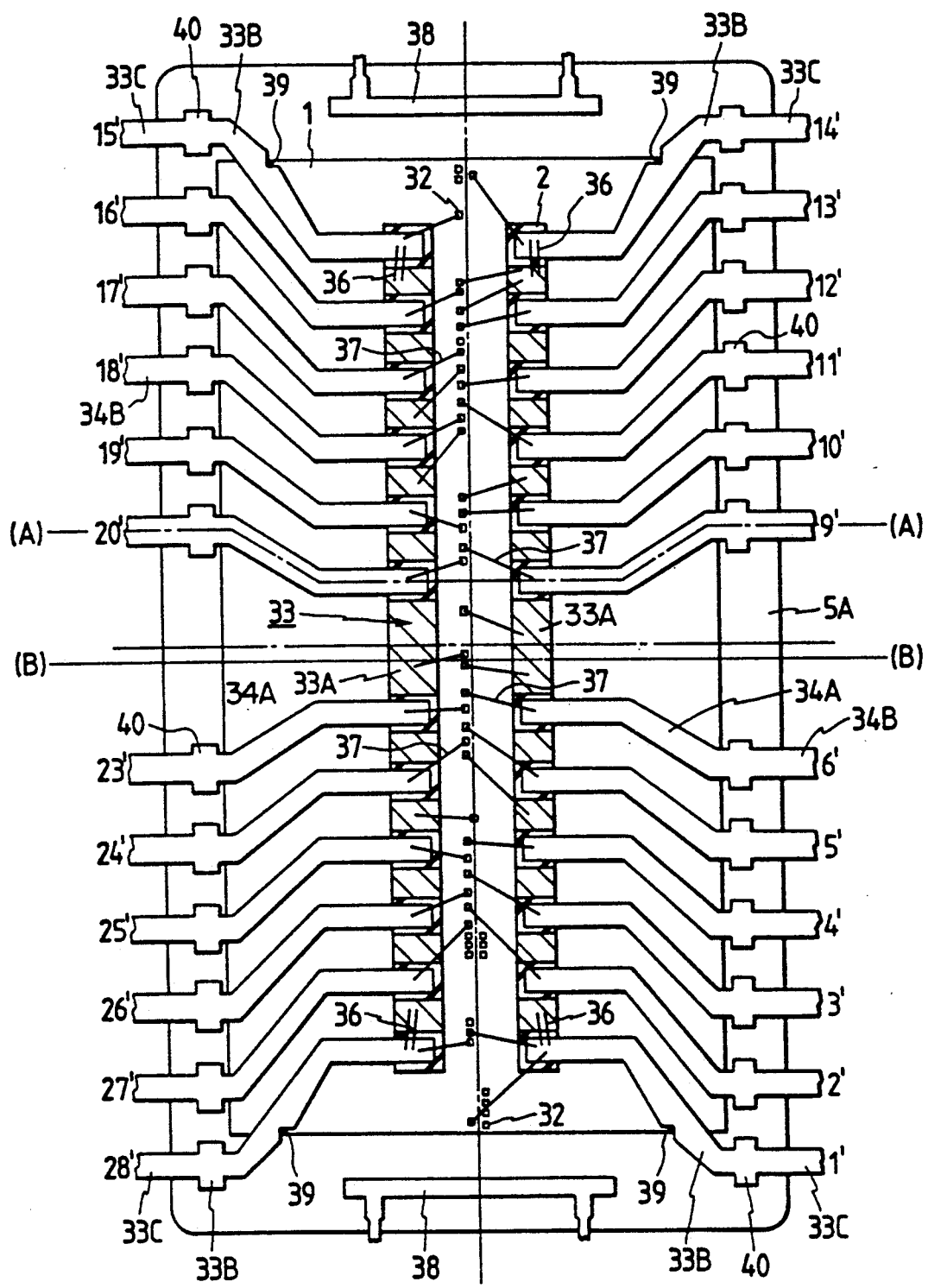
FIG. 1 is a plan view of a resin-molded type semiconductor device according to a first embodiment of the present invention, with an upper half of a molded resin portion being removed.

The present invention will be described with respect to preferred embodiments hereinunder. As can be appreciated, these preferred embodiments are described for purposes of illustration, and are not limiting of the present invention. In all of the drawings for the illustration of embodiments, portions having the same functions are indicated by the same reference numerals and repeated explanations thereof will be omitted.

Embodiment 1

Figure 2:
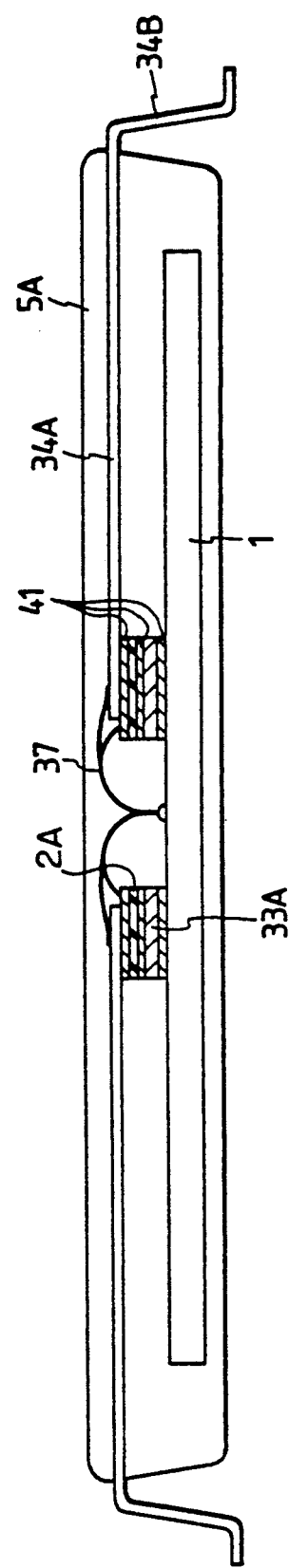
FIG. 2 is a sectional view taken on line (A)—(A) in FIG. 1.
Figure 3:
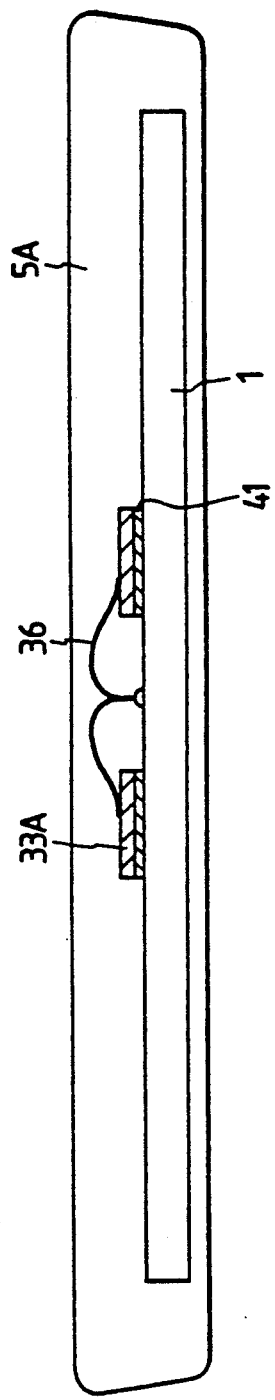
FIG. 3 is a sectional view taken on line (B)—(B) in FIG. 1.
Figure 4:
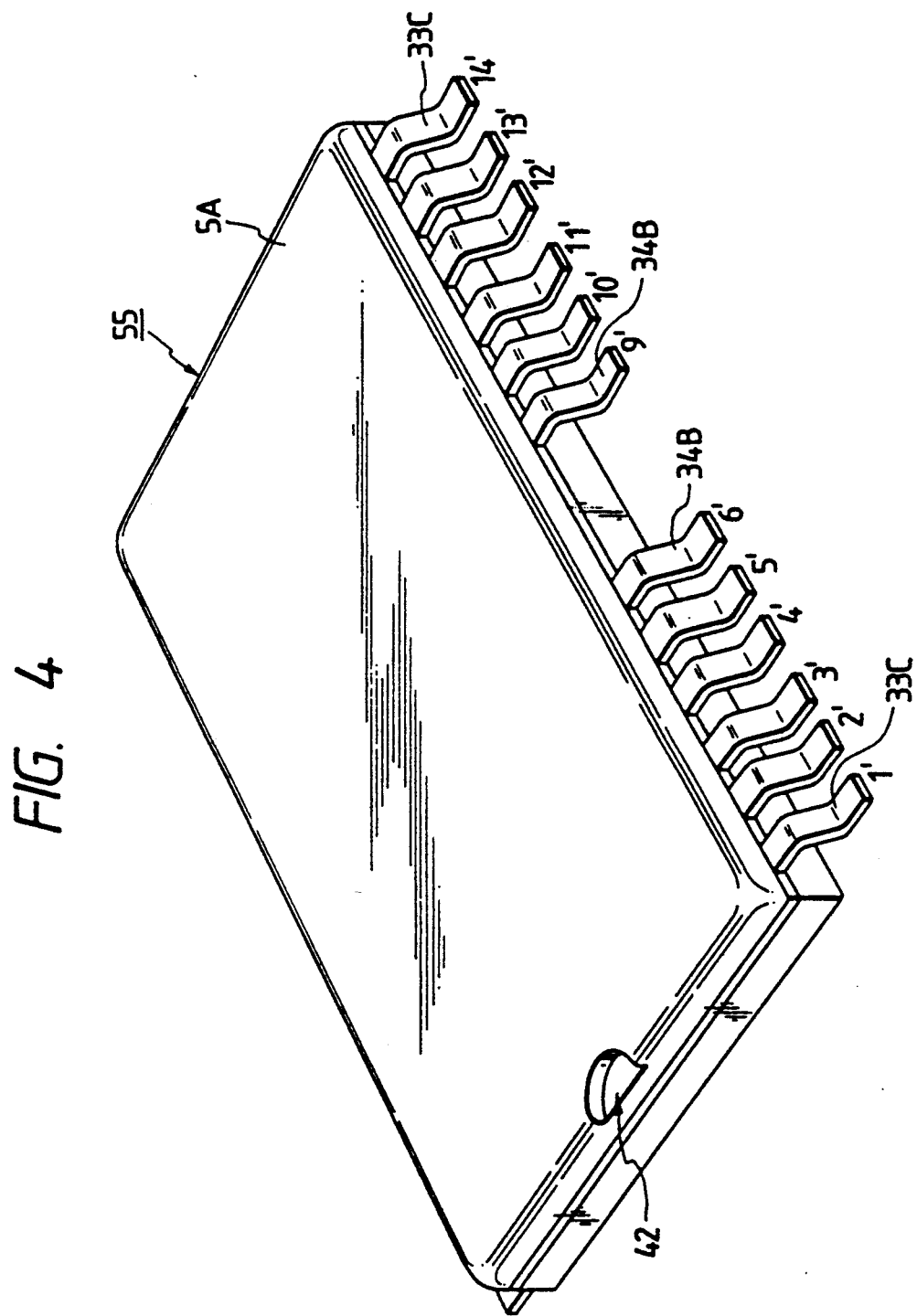
FIG. 4 is a perspective view showing an appearance of an entire construction of the resin-molded type semiconductor device of the first embodiment.

FIG. 1 is a plan view of a resin-molded type semiconductor device according to the first embodiment of the present invention, with an upper half of a molded resin portion being removed; FIG. 2 is a sectional view taken on line (A)—(A) in FIG. 1; FIG. 3 is a sectional view taken on line (B)—(B) in FIG. 1; and FIG. 4 is a perspective view showing an appearance of an entire construction of the resin-molded type semiconductor device of this first embodiment.

In the resin-molded type semiconductor device of the first embodiment, as shown in FIGS. 1 to 4, two thin metal sheets 33A as part of a common inner lead (also called a bus bar inner lead) 33 are fixedly bonded, with an insulating adhesive 2, to a longitudinal central portion of a circuit-forming surface (hereinafter referred to as the "principal surface") of a memory semiconductor chip 1 which constitutes a DRAM (dynamic random access memory), for example. A plurality of inner leads 34A for signals are fixedly bonded with the insulating adhesive 2 onto the metal sheets 33A in a transverse relation to the metal sheets.

On the principal surface of the semiconductor chip there are arranged mainly a memory cell array and a peripheral circuitry.

For example, the metal sheets 33A are formed using Fe-Ni alloy (42 alloy: 42% Ni-Fe), or Cu. Such materials for the metal sheets 33A are illustrative only, and not limiting.

As the insulating adhesive 2 there is used, for example, a polyether amide-imide resin or an epoxy resin.

This type of a resin-molded package 55 adopts a so-called LOC (Lead On Chip) structure wherein the inner lead 33 and the inner leads for signals 34A are arranged on the semiconductor chip 1. In the resin-molded type package 55 having the LOC structure, since the inner leads for signals 34A can be extended freely without being restricted by the shape of the semiconductor chip 1, it is possible to seal the semiconductor chip 1 which is larger in size by an amount corresponding to such lead extension. That is, in the resin-molded type package 55 having the LOC structure, even if the semiconductor chip 1 becomes larger in size for attaining a larger capacity, the seal size (package size) can be kept small, so it is possible to increase the packaging density.

The common inner lead 33 comprises the thin metal sheets 33A and inner leads 33B formed integrally with outer leads 33C, the thin metal sheets 33A and the inner leads 33B being electrically connected together using bonding wires 36. The inner leads for signals 34A, on one end side thereof, are formed integrally with outer leads 34B. As to the outer leads 33C and 34B, signals to be applied thereto are specified and numbers are assigned thereto in accordance with standard specifications (FIG. 2). The resin-molded type package 5 is composed of a total of twenty-four terminals which are No. 1' to No. 6' terminals, No. 9' to No. 14' terminals, No. 15' to No. 20' terminals, and No. 23' to No. 28' terminals.

No. 1' terminal is a source voltage Vcc terminal. For example, the source voltage is a circuit operating voltage 5 V for example. No. 2' terminal is a data input signal terminal (D), No. 3' terminal is a vacant terminal, No. 4' terminal is a write enable signal terminal (W), No. 5' terminal is a row address strobe signal terminal (RE), and No. 6' terminal is an address signal terminal ($A_{11}$).

No. 9' terminal is an address signal terminal ($A_{10}$), No. 10' terminal is an address signal terminal ($A_0$), No. 11' terminal is an address signal terminal ($A_1$), No. 12' terminal is an address signal terminal ($A_2$), No. 13' terminal is an address signal terminal ($A_3$), and No. 14' terminal is a source voltage Vcc terminal.

No. 15' terminal is a reference voltage Vss terminal. For example, the reference voltage Vss is a circuit reference voltage OV. No. 16' terminal is an address signal terminal (A4), No. 17' terminal is an address signal terminal (A5), No. 18' terminal is an address signal terminal (A6), No. 19' terminal is an address signal terminal (A7), and No. 20' terminal is an address signal terminal (A8).

No. 23' terminal is an address signal terminal (A9), No. 24' terminal is a vacant terminal, No. 25' terminal is a column address strobe signal terminal (CAS), No. 26' terminal is a vacant terminal, No. 27' terminal is a data output signal terminal, and No. 28' terminal is a reference voltage Vss terminal.

The other end sides of the inner leads 33B and 34A are extended to the central side of the semiconductor chip 1 across the longer sides of a rectangular shape of the same chip. The front ends of the inner leads 34A on the semiconductor chip 1 are electrically bonded, with bonding wires 37, to bonding pads (external terminals) 32 arranged centrally of the chip. As the bonding wires 36 and 37 there are used, e.g., gold (Au) wires. Copper (Cu) wires or coated wires obtained by coating the surface of metal wires with an insulating resin are also employable as the bonding wires 36 and 37. The bonding of the bonding wires 36 and 37 can be performed, illustratively, by a bonding method which uses a combination of thermopressure bonding and ultrasonic vibration, as is known in the art. Other bonding techniques can be used.

The Vcc leads 33B and Vss leads 33B of the common inner lead 33 are extended in parallel in a region defined by the front ends of the other inner leads (inner leads for signal) 34A on the semiconductor chip 1. Those Vcc, Vss leads 33B are constructed to permit the supply of source voltage Vcc and reference voltage Vss in any position of the principal surface of the semiconductor chip. Thus, the resin-molded type semiconductor device of this embodiment is constructed to facilitate the absorption of power source noises and attain a speed-up of operation.

On the shorter sides of the rectangular shape of the semiconductor chip 1 there are provided package supporting leads 38, as shown in FIG. 1.

In predetermined positions of the inner leads corresponding to No. 1', No. 14', No. 15' and No. 28' terminals there are formed positioning notches 39 for positioning between the semiconductor chip 1 and the leads, as shown in FIG. 1.

In the chip-lead bonding, if the semiconductor chip 1 is positioned within a predetermined positional range defined by the positioning notches 39 and positioning projections 40 of the inner leads 33B, 34A, it follows that the chip and the leads are in an exact positional relation to each other.

The inner leads 33B, 34A, outer leads 33C, 34B and package supporting leads 38 are cut from a lead frame and molded. For example, the lead frame is formed using Fe-Ni (e.g., Ni content 42% or 50%) alloy, or Cu.

The semiconductor chip 1, bonding wires 36, 37, common inner leads 33, inner leads for signals 34A and package supporting leads 38 are sealed with a molding resin 5A, by techniques known in the art. As the molding resin 5A, for example, there can be used an epoxy resin in which is incorporated a phenolic curing agent, a silicone rubber and a filler in order to attain the reduction of stress. The silicone rubber has a function of reducing both the elastic modulus and the coefficient of thermal expansion of the epoxy resin. The filler is formed by spherical silicon oxide particles and also has a function of reducing the thermal expansion coefficient.

According to the layout of the semiconductor chip 1 shown in FIG. 1, the bonding pads (external terminals) 32 (FIG. 1) and peripheral circuits are provided centrally in X (or Y) direction of the principal surface of the chip. And on both sides of these bonding pads and peripheral circuits there are provided a large number of memory cell rows (memory mat).

As can be appreciated, the bonding pads need not be centrally positioned, in the present invention. That is, the bonding pads can be located peripherally on the chip 1, and the inner leads for signals and common inner lead are positioned relative to each other in a stacked relationship, e.g., at a peripheral portion of the chip 1, according to the present invention.

FIG. 2 is a sectional view taken on line (A)—(A) in FIG. 1, showing the details of the bonded portion between the inner leads for signals 34A and the semiconductor chip 1.

In FIG. 2, the metal sheets 33A are attached to the semiconductor chip 1 through an insulating polyimide adhesive layer 41. Further, the inner leads for signals 34A are bonded onto the metal sheets 33A through a sheet comprising an insulating polyimide base 2A and insulating polyimide adhesive layers 41 formed on both sides of the base 2A. As can be appreciated, the base 2A can be made of other known insulating materials, providing a necessary disclosed insulating function; and the adhesive layers can be made of other known adhesive materials providing the necessary adhesion during construction and operation of the device.

FIG. 3 is a sectional view taken on line (B)—(B) in FIG. 1, showing the details of the bonded portion between the metal sheets 33A which constitute the common inner lead 33 and the semiconductor chip 1. The metal sheets 33A are each formed on the semiconductor chip 1 each through an insulating polyimide adhesive layer 41. Of course, other known adhesive materials can be used for the adhesive layer 41.

FIG. 4 is a perspective view showing an appearance of an entire construction of the resin-molded type semiconductor device used in the first embodiment. The resin-molded type semiconductor device used in the first embodiment is a surface-mounted type thin package, e.g., TSOP (thin small outline package), having leads formed in the shape of a gull wing. The outer leads 33C and 34B project in a leaving direction from the molding resin 5A and the front ends thereof extend in parallel with the upper or lower surface of the molding resin 5A. Further, an index 42 is provided in a predetermined position of the package indicated at 55.

How to assemble the resin molded type semiconductor device of the first embodiment will be described below with reference to FIGS. 5(A) to (G) and FIGS. 6(A) to (C).

Figure 5A:
FIGS. 5(A) to 5(G) are sectional views for explaining how to manufacture the resin-molded type semiconductor device of the first embodiment.
Figure 5B:
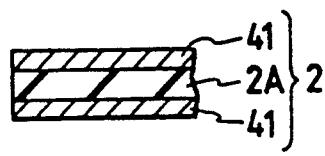
Figure 5C:
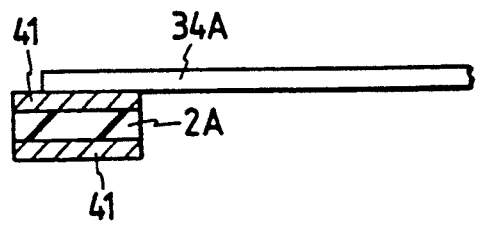
Figure 6A:
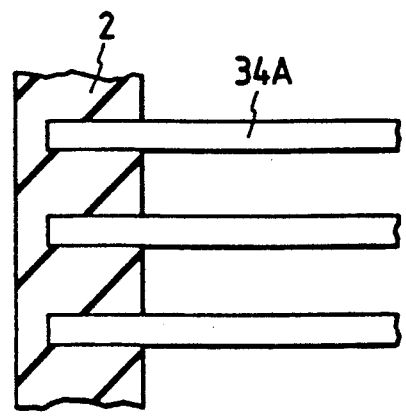
FIGS. 6(A) and 6(B) are plan views of the semiconductor device corresponding to FIG. 5(C)
Figure 6B:
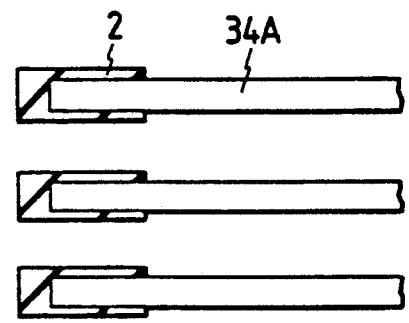

First, an insulating polyimide base 2A is prepared and an insulating adhesive 41 is applied to both sides of the base 2A to obtain an insulating polyimide tape 2, as shown in FIG. 5(B). Then, as shown in FIG. 5(C), the insulating polyimide tape 2 is thermopressure-bonded to front-end regions of inner leads 33B and 34A of a lead frame formed by punching for example. This state is shown as a plan view in FIG. 6(A). Further, as shown in FIG. 6(B), unnecessary portions of the insulating polyimide tape 2 are punched off into a comb teeth-like shape.

As seen in FIG. 5(C), desirably the insulating polyimide tape 2 is provided so as to extend beyond the end of front-end regions of inner leads 33B and 34A of the lead frame. The tape is so provided to extend beyond the end of the inner leads in order to provide a margin of error (alignment margin) to ensure that the inner leads do not extend beyond the end of the tape 2 whereby a void could be created beneath the front-end regions of the inner leads upon resin-molding.

Figure 5D:

On the other hand, a metal sheet, e.g., 42 alloy sheet, for the common inner lead 33 is prepared and the insulating adhesive 41 is applied to one side of the sheet, followed by punching into a desired shape to form a metal sheet 33A [FIGS. 5(D) and (E)]. Next, as shown in FIG. 5(F), the metal sheet 33A coated with the insulating adhesive 41 is thermopressure-bonded to a longitudinal central portion of a principal surface of a semiconductor chip 1.

Figure 5E:
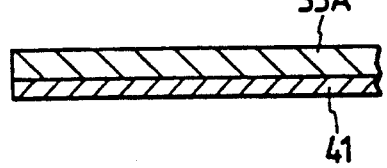
Figure 5F:
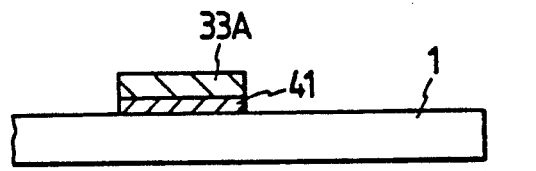
Figure 5G:
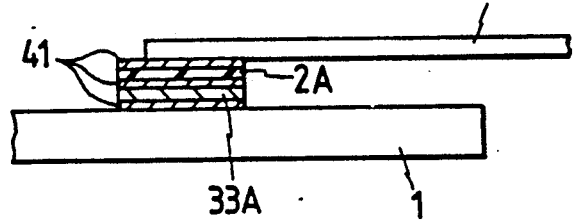
Figure 6C:
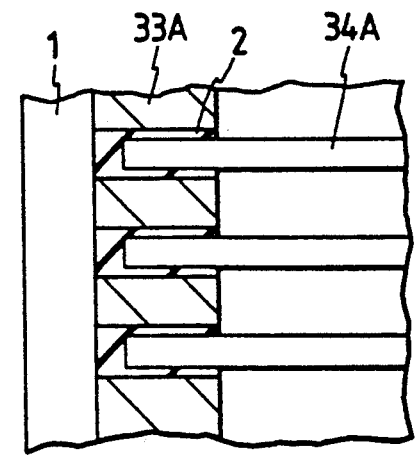
FIG. 6(C) is a plan view of the semiconductor device corresponding to FIG. 5(G)

Then, the leads with insulating polyimide tape formed in FIGS. 5(A) to (C) and the semiconductor chip with metal sheet formed in FIGS. 5(D) to (F) are thermopressure-bonded [FIG. 5(G)]. FIG. 6(C) is a plan view of FIG. 5(G).

For example, the insulating polyimide base 2A and the insulating adhesive layer 41 are each 25 μm thick, the insulating polyimide tape 2 is 75 μm thick, and the metal sheet 33A is 50 μm.

Desirably, the metal sheet has a minimum thickness of 25 μm, in order to achieve stable wire bonding thereto. The maximum thickness of the metal sheet is desirably less than the lead frame thickness (e.g., 125 μm) to achieve the advantage of decreased LOC thickness.

Next, the metal sheets 33A and inner leads 33B of the common inner lead 33, bonding pads 32 on the semiconductor chip 1 and the metal sheets 33A, and the bonding pads 32 and the inner leads for signal 34A, are electrically connected respectively by wire bonding (wires 36 and 37).

Then, after molding with the molding resin 5A, outer leads 33C and 34B are plated and cut off from an outer frame of the lead frame, followed by shaping the outer leads.

Lastly, package supporting leads are cut to complete the assembly of the resin-molded type semiconductor device.

Figure 7A:
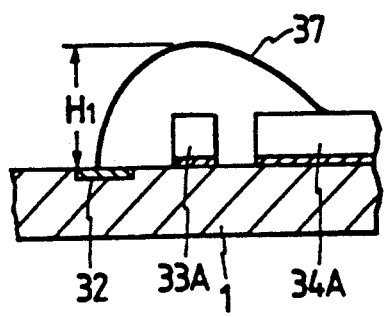
FIGS. 7(A) and 7(B) are views showing the loop height of a bonding wire, with FIG. 7(A) showing a prior art structure.

In such construction of the semiconductor device, since the metal sheets (tape-like) 33A of the common inner lead 33 extend across the semiconductor chip 1, it is possible to effect a multiple bonding. Moreover, since the metal sheets 33A of the common inner lead 33 are formed below the inner leads for signals 34A in a stacked fashion, there is no fear of the bonding wires 37 extending over the metal sheets 33A of the common inner lead 33. Further, as shown in FIGS. 7(A) and (B), it is possible to reduce the height from the principal surface of the semiconductor chip 1 up to the top of each bonding wire 37. For example, in the present invention the height can be reduced to one half or so of that in the prior art shown in FIG. 7(A). Additionally, since the bonding wires 37 will never go over the metal sheets 33A, there is no fear of a short-circuit of the bonding wires 37 with the metal sheets 33A, even when the bonding wires are deformed during molding. Because of these points it is possible to provide a semiconductor device of a thin package.

Figure 7B:
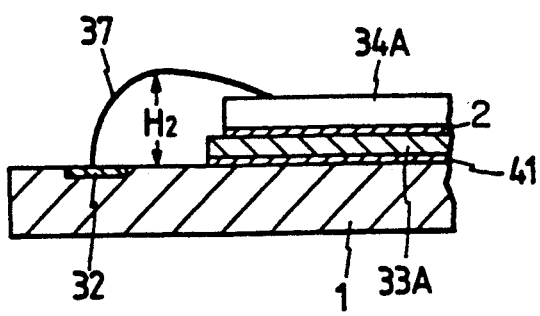

FIG. 7(A) illustrates the height of a conventional bonding wire 37, while FIG. 7(B) illustrates the height of the bonding wire 37 used in the present invention.

According to the prior art, the loop height $H_1$ is about 600 μm, while in this embodiment of the present invention the loop height $H_2$ is about 300 μm.

Besides, since the semiconductor chip 1 is fixed by the common inner lead 33 and the inner leads for signal 34A, it is not necessary to fix the package supporting leads 38 to the principal surface of the semiconductor chip 1, so there is no fear of said principal surface being damaged by the package supporting leads 38. Moreover, since it is not necessary to provide an insulating tape at each end portion of the principal chip surface, there will be no package crack from the insulating tape during reflow.

In the foregoing, the common inner lead 33 has been described as formed from a sheet, by, e.g., punching into a desired shape. Such technique for forming the common inner lead 33 is preferred in view of cost considerations.

However, other techniques can be used to form the common inner lead 33. For example, plating (e.g., vacuum deposition) can be used to form the common inner lead 33. Thus, illustratively, a thin (e.g., 1000Å thick) layer of tungsten or titanium/tungsten alloy can be provided overlying the semiconductor chip 1, with a metal layer (e.g., of copper or gold) provided on the layer of tungsten or titanium/tungsten alloy. This metal layer, illustratively, has a thickness of 30 μm, and is formed by vacuum deposition. The combination of thin layer and metal layer form the common inner lead.

Embodiment 2

Figure 8:
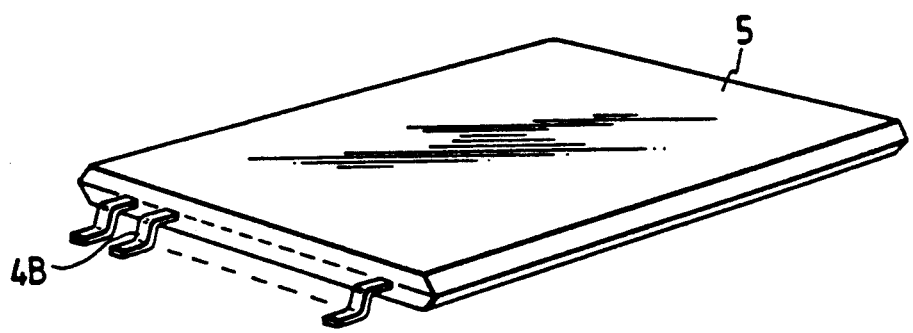
FIG. 8 is a perspective view showing an appearance of an entire construction of a resin molded type semiconductor device according to a second embodiment of the present invention.
Figure 9:
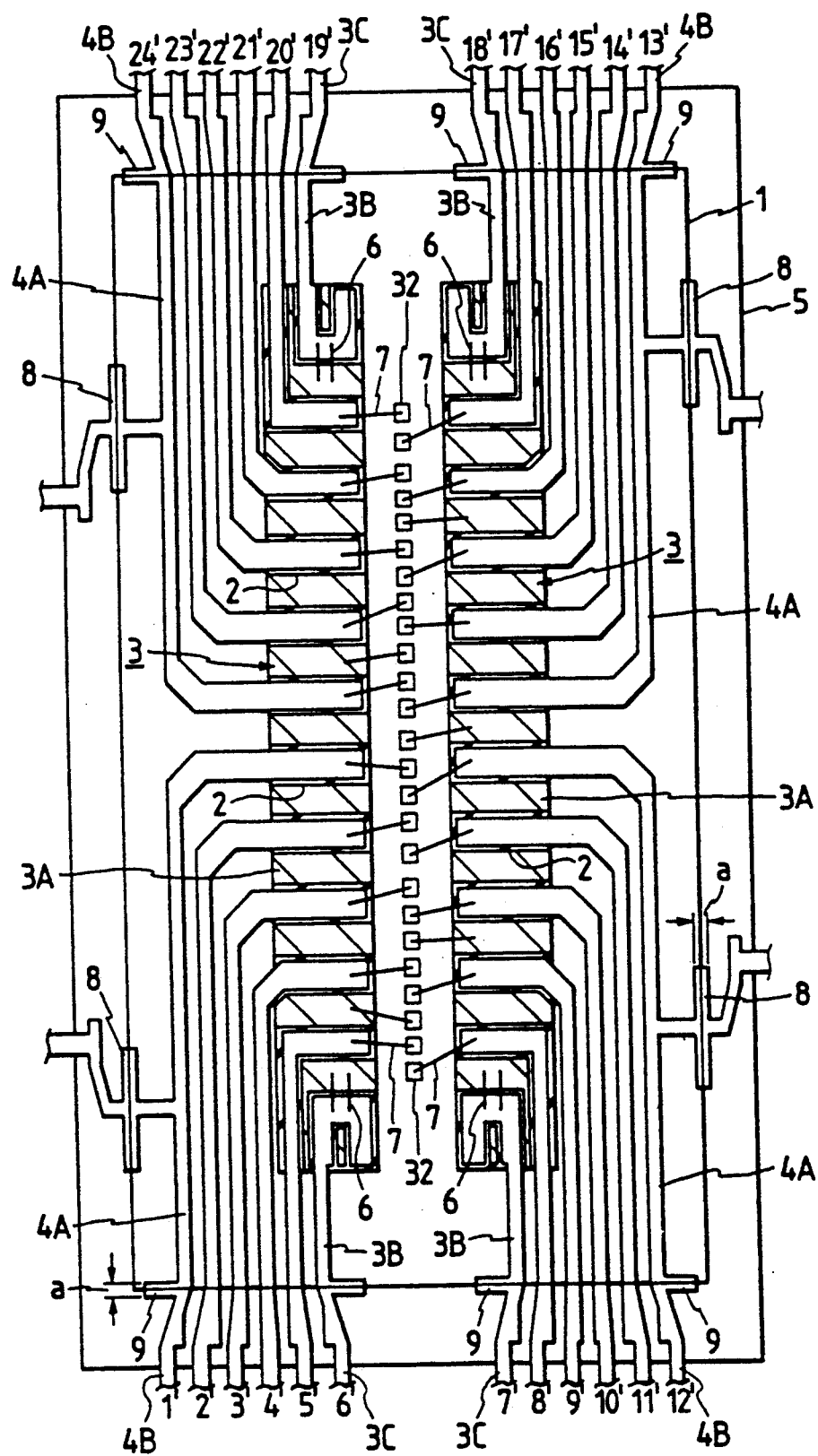
FIG. 9 is a plan view of a resin-molded type semiconductor device according to this second embodiment of the present invention.

FIG. 8 is a perspective view showing an appearance of an entire construction of a resin-molded type semiconductor device according to the second embodiment of the present invention, and FIG. 9 is a plan view thereof, with an upper half of a molding resin layer being removed.

The resin sealed package, indicated at 5, of this second embodiment is a thin package with leads projecting in a gull wing shape from shorter sides of a resin-molded type package of a rectangular shape.

Like the first embodiment, two thin metal sheets 3A as part of a common inner lead (also called a bus bar inner lead) 3 are fixedly bonded, using an insulating adhesive 2, to a longitudinal central portion of a circuit forming surface (hereinafter referred to as the "principal surface") of a semiconductor chip 1. Onto the metal sheets 3A are fixedly bonded a plurality of inner leads for signals 4A in a transverse relation to the metal sheets 3A, using the insulating adhesive 2.

The common inner lead 3 comprises the thin metal sheets 3A and inner leads 3B formed integrally with outer leads 3C, the thin metal sheets 3A and the inner leads 3B being electrically connected with each other through bonding wires 6. The inner leads for signals 4A, on one end side, are integral with outer leads 4B. Signals to be applied to the outer leads 3C and 4B are specified and numbers are assigned thereto in accordance with standard specifications. The resin sealed type package 5 is composed of a total of twenty-four terminals which are No. 1' to No. 6' terminals, No. 7' to No. 12' terminals, No. 13' to No. 18' terminals, and No. 19' to 24' terminals.

The other end sides of the outer leads 3C and 4B are extended to the central side of the semiconductor chip 1 across the shorter sides of the rectangular shape of the chip. The front ends of the inner leads 4B on the semiconductor chip 1 are electrically connected through bonding wires 7 to bonding pads (external terminals) 32 arranged centrally of the chip.

Out of the metal sheets 3A and inner leads 3B of the common inner lead 3, the inner leads 3B corresponding to No. 6' terminal and No. 19' terminal are used as leads for Vcc and are extended in parallel with the longer sides of the semiconductor chip 1 at the central portion of the chip. Likewise, the inner leads 3B corresponding to No. 7' terminal and No. 18' terminal are used as leads to Vss.

The Vcc leads 3B and Vss leads 3B of the common lead 3 are extended in parallel in a region defined by the front ends of the other inner leads (inner leads for signals) 4A on the semiconductor chip. The Vcc and Vss leads 3B are constructed to permit the supply to source voltage Vcc and reference voltage Vss in any position of the principal surface of the chip.

On the other sides of the semiconductor chip 1 there are provided package supporting leads 8, as shown in FIG. 9. The package supporting leads 8 are disposed in positions spaced slightly from the principal surface of the chip 1.

In predetermined positions of the inner leads corresponding to No. 1', No. 6', No. 7', No. 12', No. 13', No. 18', No. 19' and No. 24' terminals there are formed positioning projections 9 for positioning between the semiconductor chip 1 and the leads.

If the chip 1 is positioned so that its edge portions are within the width a (FIG. 9) of each package supporting lead 8 and that of each positioning projection 9, it follows that the chip and the leads are in exact positions.

Like the package supporting leads 8, the positioning projections 9 are also located in positions slightly spaced from the principal surface of the semiconductor chip 1.

Embodiment 3

Figure 10:
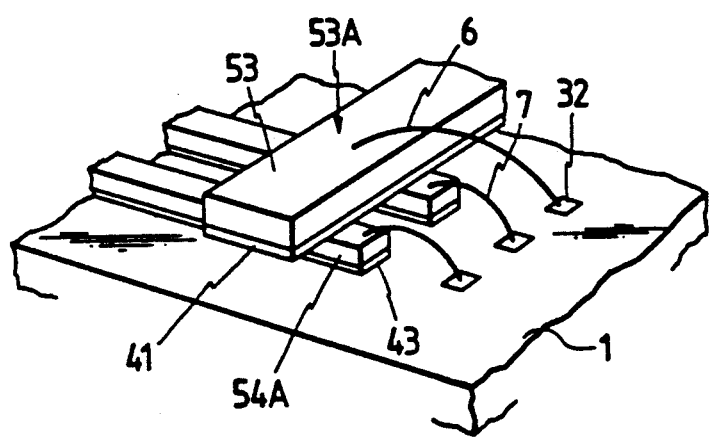
FIG. 10 is a view showing a principal portion of a third embodiment of the present invention.

FIG. 10 illustrates a principal portion of a third embodiment of the present invention. According to this third embodiment, in the resin-molded type semiconductor device of the previous embodiment, inner leads for signals 54A are disposed on the principal surface of the semiconductor chip 1 through an insulating adhesive 41, and a metal sheet 53A of a common inner lead 53 is disposed on the inner leads for signals 54A.

The semiconductor device of this third embodiment is assembled in the following manner. First, a lead frame with an insulating adhesive 43 is mounted in a predetermined position of the semiconductor chip 1 and then the metal sheet 53A having a coating of an insulating adhesive 41 is mounted. The insulating adhesive 43 can be an insulating polyimide tape, constituted by an insulating base and adhesive layers on both sides of the insulating base. Wire bonding for the common lead 53 is performed above the leads fixed to the principal surface of the semiconductor chip 1 (using wire 6). This is for preventing a defective pressure-bonding of wire in the bonding operation.

As seen in FIG. 10, the front-end regions of the inner leads for signals 54A extend beyond the edge of metal sheet 53A. A distance that such front-end regions extend beyond the edge of metal sheet 53A is to be enough such that the bonding wires 7 can be bonded to the front-end regions of these inner leads. Such a distance should desirably be at least 600 μm, in order to achieve satisfactory bonding.

As seen in FIG. 10, an insulating adhesive 41 is provided between the inner leads for signals 54A and the metal sheet 53A. Such insulating adhesive can be provided between (1) the metal sheet 53A, and, e.g., (2) Vcc leads and Vss leads (not shown in FIG. 10), with bonding wires providing electrical connection between a respective metal sheet 53A and the Vcc or Vss leads (such connection between the Vcc or Vss leads and the metal sheet is shown in the first two embodiments).

Alternatively, the insulating adhesive 41 can be omitted between the metal sheet 53A and the Vcc or Vss leads, with such metal sheet (as the upper layer as compared to the position of the leads) being microwelded to the Vcc or Vss leads. This technique provides a direct connection between the Vcc or Vss leads (e.g., power supply pins) and the metal sheet.

Effects obtained by the typical aspects of the present invention disclosed herein will be described below briefly.

(1) It is possible to perform a multiple bonding.
(2) Bonding wires need not cross over a common inner lead in order to bond the inner leads for signals to bonding (terminal) pads of the semiconductor chip.
(3) It is possible to reduce the height from the principal surface of the semiconductor chip up to the top of each bonding wire, in, e.g., looping the bonding wire from the inner leads for signals to the bonding pads.
(4) Even if the bonding wires are deformed during molding, there is no fear of a short-circuit thereof with the common inner lead.

The above points permit the provision of a semiconductor device of a thin package having high reliability.

While we have shown and described embodiments in accordance with our invention, it is to be understood that the same is susceptible of numerous changes and modifications as will be apparent to one of ordinary skill in the art. Therefore, we do not intend to be limited to the details shown and described herein but intend to cover all such changes and modifications as are encompassed by the scope of the appended claims.

What is claimed is:

1. A semiconductor device comprising:
   a semiconductor chip having on a principal surface thereof a plurality of external terminals;
   leads comprising first leads for providing voltages and second leads for providing signals, each of said first and second leads comprising an inner lead portion having a first part and a second part and an outer lead portion connected to said second part and extending in a direction away from said first part;
   a metal layer interposed between the principal surface of the semiconductor chip and the first part of said inner lead portion of the leads, said first part of said inner lead portion of the leads overlying said metal layer, the metal layer being connected electrically to the first leads; and
   a plurality of wires comprising first wires and second wires, said first wires electrically connecting the first part of said inner lead portion of the second leads with a first group of said plurality of the external terminals, said second wires electrically connecting said metal layer with a second group of said plurality of the external terminals.

2. A semiconductor device according to claim 1, wherein the first part of the inner lead portion of the leads is stacked upon said metal layer.

3. A semiconductor device according to claim 1, wherein the semiconductor chip is substantially rectangular, and has integrated circuits on the principal surface thereof.

4. A semiconductor device according to claim 1, further comprising a molded member covering said semiconductor chip, said inner lead portions, said metal layer and said plurality of wires.

5. A semiconductor device according to claim 4, wherein said molded member is made of a resin material, whereby the semiconductor device is a resin-molded semiconductor device.

6. A semiconductor device according to claim 5, wherein the semiconductor chip is substantially rectangular, and wherein the second part of said inner lead portion of each lead is arranged on shorter sides of the semiconductor chip.

7. A semiconductor device according to claim 4, further comprising an adhesive layer, for bonding, between the principal surface of the semiconductor chip and said metal layer.

8. A semiconductor device according to claim 7, further comprising an insulating base interposed between said metal layer and the first part of said inner lead portion of the leads.

9. A semiconductor device according to claim 8, further comprising adhesive layers respectively on surfaces of the insulating base adjacent the metal layer and the first part of said inner lead portion of the leads.

10. A semiconductor device according to claim 4, wherein the semiconductor chip is substantially rectangular, and wherein said external terminals are arranged substantially in parallel with longer sides of the semiconductor chip and in a central region of the chip.

11. A semiconductor device according to claim 10, wherein said metal layer is formed in a continuous manner along said external terminals.

12. A semiconductor device according to claim 4, further comprising connecting wires for electrical connection between said first leads and said metal layer.

13. A semiconductor device according to claim 12, wherein said first leads and said metal layer are electrically connected at a plurality of points.

14. A semiconductor device according to claim 4, wherein said metal layer is constituted by an iron-nickel alloy sheet.

15. A semiconductor device according to claim 4, wherein the semiconductor chip is substantially rectangular, and wherein the second part of said inner lead portion of each lead is arranged on longer sides of the semiconductor chip.

16. A semiconductor device according to claim 1, wherein portions of the metal layer are exposed between adjacent first parts of said inner lead portions of the leads, and wherein said second wires electrically connect the exposed metal layer portions and the second group of said plurality of the external terminals.

17. A semiconductor device according to claim 1, wherein the second wires have two ends, and wherein one end of each of the second wires is connected to the metal layer, and the other end of each of the second wires is connected to the second group of the external terminals.

18. A semiconductor device according to claim 1, wherein the metal layer is a metal foil.

19. A semiconductor device according to claim 1, wherein the first wires do not cross over the metal layer.

20. A semiconductor device according to claim 1, wherein an area of the principal surface of the semiconductor chip, between the external terminals and an area of the principal surface having the leads thereover, is free of a bus bar inner lead thereover.

21. A semiconductor device according to claim 1, wherein said semiconductor chip has a memory cell array and peripheral circuitry.

22. A semiconductor device according to claim 1, wherein said semiconductor chip is substantially rectangular, and wherein points where the first wires are electrically connected to the first part of the inner lead portion of the second leads are arranged substantially in a line which is in a direction parallel with longer sides of the semiconductor chip.

23. A semiconductor device according to claim 1, wherein said metal layer is smaller than the semiconductor chip.

24. A semiconductor device comprising:
a semiconductor chip having on a principal surface thereof a plurality of external terminals;
leads comprising first leads for providing voltages and second leads for providing signals, each of said first and second leads comprising an inner lead portion having a first part and a second part and an outer lead portion connected to said second part and extending in a direction away from said first part;
a metal layer stacked on the first part of said inner lead portion of the leads, overlying said first part of said inner lead portion of the leads, and connected electrically to said first leads; and
a plurality of wires comprising first wires and second wires, said first wires electrically connecting the first part of said inner lead portion of the second leads with a first group of the external terminals, said second wires electrically connecting said metal layer with a second group of the external terminals.

25. A semiconductor device according to claim 24, wherein the semiconductor chip is substantially rectangular, and has integrated circuits on the principal surface thereof.

26. A semiconductor device according to claim 24, further comprising a molded member covering said semiconductor chip, said inner lead portions, said metal layer and said plurality of wires.

27. A semiconductor device according to claim 26, wherein said molded member is made of a resin material, whereby the semiconductor device is a resin-molded semiconductor device.

28. A semiconductor device according to claim 26, further comprising an insulating base interposed between the principal surface of the semiconductor chip and the first part of said inner lead portion of the leads.

29. A semiconductor device according to claim 28, further comprising adhesive layers respectively on surfaces of the insulating base adjacent the principal surface of the semiconductor chip and the first part of said inner lead portion of the leads.

30. A semiconductor device according to claim 28, further comprising an adhesive layer for bonding, between the first part of said inner lead portion of the leads and said metal layer.

31. A semiconductor device according to claim 26, wherein the semiconductor chip is substantially rectangular, and wherein said external terminals are arranged substantially in parallel with longer sides of the semiconductor chip and in a central region of the chip.

32. A semiconductor device according to claim 31, wherein said metal layer is formed in a continuous manner along said external terminals.

33. A semiconductor device according to claim 26, further comprising wires for electrical connection between said first leads and said metal layer.

34. A semiconductor device according to claim 33, wherein said first leads and said metal layer are electrically connected at a plurality of points.

35. A semiconductor device according to claim 26, wherein said metal layer is constituted by an iron-nickel alloy sheet.

36. A semiconductor device according to claim 26, wherein the semiconductor chip is substantially rectangular, and wherein the second part of said inner lead portion of each lead is arranged on a longer side of the semiconductor chip.

37. A semiconductor device according to claim 26, wherein the semiconductor chip is substantially rectangular, and wherein the second part of said inner lead portion of each lead is arranged on a shorter side of the semiconductor chip.

38. A semiconductor device according to claim 24, wherein said semiconductor chip has a memory cell array and peripheral circuitry.

39. A semiconductor device according to claim 24, wherein said semiconductor chip is substantially rectangular, and wherein points where the first wires are electrically connected to the first part of the inner lead portion of the second leads are arranged substantially in a line which is in a direction parallel with longer sides of the semiconductor chip.

40. A semiconductor device according to claim 24, wherein said metal layer is smaller than the semiconductor chip.

41. A semiconductor device according to claim 24, wherein an area of the principal surface of the semiconductor chip, between the external terminals and an area of the principal surface having the leads thereover, is free of a bus bar inner lead thereover.

42. A semiconductor device according to claim 24, wherein said second wires are connected to the metal layer at locations directly over said first part of the inner lead portion of the second leads.

43. A semiconductor device according to claim 24, wherein the first part of the inner lead portion of the second leads has exposed structure that extends, in a direction toward the external terminals, beyond the metal layer, and wherein the first wires are connected to the exposed structure of the first part of the inner lead portion of the second leads.

44. A semiconductor device according to claim 24, wherein the second wires have two ends, and wherein one end of each of the second wires is connected to the metal layer, and the other end of each of the second wires is connected to the second group of the external terminals.

* * * * *